(12) United States Patent
Zhou et al.

(10) Patent No.: US 9,313,896 B2
(45) Date of Patent: Apr. 12, 2016

(54) DOUBLE-LAYERED TRANSPARENT CONDUCTIVE FILM AND MANUFACTURING METHOD THEREOF

(71) Applicant: NANCHANG O-FILM TECH. CO., LTD., Nanchang (CN)

(72) Inventors: Fei Zhou, Nanchang (CN); Yulong Gao, Nanchang (CN); Miaoqian Cao, Nanchang (CN); Ying Gu, Nanchang (CN)

(73) Assignee: Nanchang O-Film Tech. Co., Ltd., Nanchang, Jiangxi (CN)

( * ) Notice: Subject to any disclaimer, the term of this patent is extended or adjusted under 35 U.S.C. 154(b) by 259 days.

(21) Appl. No.: 14/000,098

(22) PCT Filed: Jul. 5, 2013

(86) PCT No.: PCT/CN2013/078930
§ 371 (c)(1),
(2) Date: Aug. 16, 2013

(87) PCT Pub. No.: WO2014/117477
PCT Pub. Date: Aug. 7, 2014

(65) Prior Publication Data
US 2014/0216788 A1    Aug. 7, 2014

(30) Foreign Application Priority Data
Feb. 4, 2013  (CN) .......................... 2013 1 0043999

(51) Int. Cl.
*B32B 3/24* (2006.01)
*H05K 3/12* (2006.01)
(Continued)

(52) U.S. Cl.
CPC ............ *H05K 3/1258* (2013.01); *H05K 1/0298* (2013.01); *H05K 3/107* (2013.01);
(Continued)

(58) Field of Classification Search
CPC .................... Y10T 428/24917; H05K 1/0298; H05K 3/1258
USPC .......................................................... 174/392
See application file for complete search history.

(56) References Cited

U.S. PATENT DOCUMENTS

2007/0207297 A1    9/2007  Lee et al.
2010/0059365 A1*   3/2010  Valentin et al. ............... 204/280
(Continued)

FOREIGN PATENT DOCUMENTS

CN       101035412 B     6/2012
CN       102708946 A    10/2012
(Continued)

*Primary Examiner* — William P. Watkins, III
(74) *Attorney, Agent, or Firm* — Coats & Bennett, P.L.L.C.

(57) ABSTRACT

A double-layered transparent conductive film includes: a first substrate; a first imprint adhesive layer formed on the first substrate, the first imprint adhesive layer defining a first mesh-shaped groove, the first mesh-shaped groove forming a first mesh; a first conductive layer including conductive material filled in the first mesh-shaped groove; a tackifier layer formed on the first imprint adhesive layer and the first conductive layer; a second substrate formed on the tackifier layer; a second imprint adhesive layer formed on the second substrate, the second imprint adhesive layer defining a second mesh-shaped groove, the second mesh-shaped groove forming a second mesh, wherein one of the first mesh and the second mesh is a regular mesh, the other is a random mesh; and a second conductive layer including conductive material filled in the second mesh-shaped groove. During the lamination, no alignment accuracy is needed, such that the production efficiency is greatly improved. A method of manufacturing the double-layered transparent conductive film is also provided.

13 Claims, 12 Drawing Sheets

(51) Int. Cl.
 *H05K 1/02* (2006.01)
 *H05K 3/10* (2006.01)
 *H05K 3/46* (2006.01)

(52) U.S. Cl.
 CPC ..... *H05K 3/4635* (2013.01); *H05K 2201/0108* (2013.01); *H05K 2201/09036* (2013.01); *H05K 2203/0278* (2013.01); *Y10T 156/1028* (2015.01); *Y10T 428/24917* (2015.01)

(56) References Cited

U.S. PATENT DOCUMENTS

2012/0312771 A1  12/2012  Cheng et al.
2013/0320322 A1  12/2013  Muto et al.
2014/0083742 A1  3/2014  Gao et al.
2014/0116754 A1  5/2014  Gao et al.

FOREIGN PATENT DOCUMENTS

| CN | 102723126 A | 10/2012 |
| CN | 102903423 A | 1/2013 |
| JP | 2010160927 A | 7/2010 |
| TW | 201236862 A | 9/2012 |
| TW | 201250336 A | 12/2012 |

\* cited by examiner

DOUBLE-LAYERED TRANSPARENT CONDUCTIVE FILM AND MANUFACTURING METHOD THEREOF

FIELD OF THE INVENTION

The present disclosure relates to conductive films, and more particularly relates to a double-layered transparent conductive film and a manufacturing method thereof.

BACKGROUND OF THE INVENTION

The transparent conductive film is a conductive film which exhibits excellent properties of high conductivity and good transmittance for visible light, thus it has a wide application prospects. Currently, the transparent conductive film has been successfully used in fields of liquid crystal display, touch panel, electromagnetic shielding, transparent surface heater of transparent electrode of the solar cell, and flexible light-emitting device, etc.

The conventional transparent conductive film usually needs to be patterned through exposure, development, etching, cleaning, and other procedures, after that a conductive region and a transmission region are formed on the surface of the substrate according to the pattern. Or a metal mesh can be formed on a specific region on the substrate by printing. The mesh in the double-layered conductive film is essential to optical performances of the film; it desires a good conductivity, as well as high transmittance for visible light and high infrared reflectivity. It is necessary to align upper and lower meshes during the design and lamination of the double-layered conductive film, so as to avoid undesirable optical phenomena as well as the color difference between the mesh areas. Therefore, an alignment accuracy of the double-layered conductive film is relatively high, usually of 10 μm, such that the undesirable optical phenomena can be avoided and a high transmittance can be guaranteed. Since the alignment accuracy in the production is relatively high, the equipment and operating requirements also have a relatively high demand.

SUMMARY OF THE INVENTION

It is one object of the present disclosure to provide a double-layered transparent conductive film which can reduce the alignment accuracy with a high light transmission and a manufacturing method thereof.

A double-layered transparent conductive film includes:
a first substrate;
a first imprint adhesive layer formed on the first substrate, the first imprint adhesive layer defining a first mesh-shaped groove, the first mesh-shaped groove forming a first mesh;
a first conductive layer including conductive material filled in the first mesh-shaped groove;
a tackifier layer formed on the first imprint adhesive layer and the first conductive layer;
a second substrate formed on the tackifier layer;
a second imprint adhesive layer formed on the second substrate, the second imprint adhesive layer defining a second mesh-shaped groove, the second mesh-shaped groove forming a second mesh, wherein one of the first mesh and the second mesh is a regular mesh, the other is a random mesh; and
a second conductive layer including conductive material filled in the second mesh-shaped groove.

In one embodiment, a ratio of an area of a middle blank area of a cell of the regular mesh to an area of the first conductive layer is greater than 95%.

In one embodiment, the cell of the random mesh is shaped as an irregular quadrilateral.

In one embodiment, the cell of the regular mesh is shaped as a rectangular.

In one embodiment, the random mesh is an irregular polygon mesh, the number of grid lines of the irregular polygon mesh having a slope in a range of (−1, 1) is greater than the number of grid lines having a slope in a range (−∞, −1) and (1, +∞); or the number of grid lines of the irregular polygon mesh having a slope in a range of (−1, 1) is less than the number of grid lines having a slope in a range (−∞, −1) and (1, +∞).

In one embodiment, the regular mesh is a hexagonal mesh.

In one embodiment, the random mesh is an irregular polygon mesh, a grid line of the irregular polygon mesh is evenly-distributed, the grid line between two nodes forms an angle θ with the horizontal X axis, the angle θ is evenly-distributed, the uniform distribution refers to the statistic value θ of each of the random grids; then gathering statistics for a probability $p_i$ of the grid lines falling within each of angle intervals at a stepper angle 5°, thus obtaining $p_1, p_2 \ldots p_{36}$ in the 36 angle intervals within 0~180°; $p_i$ satisfies that the standard deviation is less than 20% of an arithmetic mean.

A method of manufacturing a double-layered transparent conductive film includes the following steps:
coating an imprint adhesive on a surface of a first substrate to form a first imprint adhesive layer, pattern imprinting the first imprint adhesive layer to form a first mesh-shaped groove, the first mesh-shaped groove forming a first mesh;
filling the first mesh-shaped groove with conductive material and sintered, thus obtaining a first conductive layer;
bonding a tackifier layer to the first conductive layer;
bonding a second substrate to the tackifier layer, coating an imprint adhesive on a surface of the second substrate to form a second imprint adhesive layer, pattern imprinting the second imprint adhesive layer to form a second mesh-shaped groove, the second mesh-shaped groove forming a second mesh, wherein one of the first mesh and the second mesh is a regular mesh, the other is a random mesh; and
filling the second mesh-shaped groove with conductive material and sintered, thus obtaining a second conductive layer.

A double-layered transparent conductive film includes:
a substrate;
a first imprint adhesive layer formed on one surface of the substrate, a first mesh-shaped groove is defined on the first imprint adhesive layer, the first mesh-shaped groove forming a first mesh;
a first conductive layer comprising conductive material filled in the first mesh-shaped groove;
a second imprint adhesive layer formed on the other surface of the substrate, the second imprint adhesive layer is defined with a second mesh-shaped groove, the second mesh-shaped groove forming a second mesh, wherein one of the first mesh and the second mesh is a regular mesh, the other is a random mesh; and
a second conductive layer including conductive material filled in the second mesh-shaped groove.

A method of manufacturing a double-layered transparent conductive film includes the following steps:
coating an imprint adhesive on one surface of a substrate to form a first imprint adhesive layer, pattern imprinting the first imprint adhesive layer to form a first mesh-shaped groove, the first mesh-shaped groove forming a first mesh;

filling the first mesh-shaped groove with conductive material and sintered, thus obtaining a first conductive layer;

coating an imprint adhesive on the other surface of the substrate to form a second imprint adhesive layer, pattern imprinting the second imprint adhesive layer to form a second mesh-shaped groove, the second mesh-shaped groove forming a second mesh, wherein one of the first mesh and the second mesh is a regular mesh, the other is a random mesh; and filling the second mesh-shaped groove with conductive material and sintered, thus obtaining a second conductive layer.

A double-layered transparent conductive film includes:

a substrate defining a first mesh-shaped groove, the first mesh-shaped groove forming a first mesh;

a first conductive layer comprising conductive material filled in the first mesh-shaped groove;

an isolation layer disposed on the first conductive layer, the isolation layer defining a second mesh-shaped groove, the second mesh-shaped groove forming a second mesh, wherein one of the first mesh and the second mesh is a regular mesh, the other is a random mesh; and a second conductive layer comprising conductive material filled in the second mesh-shaped groove.

A method of manufacturing a double-layered transparent conductive film, comprising the following steps:

pattern imprinting a surface of a substrate to form a first mesh-shaped groove, the first mesh-shaped groove forming a first mesh;

filling the first mesh-shaped groove with conductive material and sintered, thus obtaining a first conductive layer;

coating a polymer on a surface of the first conductive layer to form an isolation layer; pattern imprinting the isolation layer to form a second mesh-shaped groove, the second mesh-shaped groove forming a second mesh, wherein one of the first mesh and the second mesh is a regular mesh, the other is a random mesh; and filling the second mesh-shaped groove with conductive material and sintered, thus obtaining a second conductive layer.

The double-layered transparent conductive film includes a first conductive layer and a second conductive layer. The first conductive layer includes conductive material filled in the first mesh-shaped groove, which forms the first mesh on the surface of the first conductive layer. The second conductive layer includes conductive material filled in the second mesh-shaped groove, which forms the second mesh on the surface of the second conductive layer. One of the first mesh and the second mesh is a regular mesh; the other is a random mesh. During the lamination or the design of the double-layered conductive film, no alignment accuracy is needed, such that undesirable optical phenomena as well as the color difference between the mesh areas can be avoided. In addition, in the production process, as no alignment accuracy is required, the production efficiency is greatly improved.

DETAILED DESCRIPTION OF THE EMBODIMENTS

Reference will now be made to the drawings to describe, in detail, embodiments of the present double-layered transparent conductive film.

Embodiment One

Figure 1A:
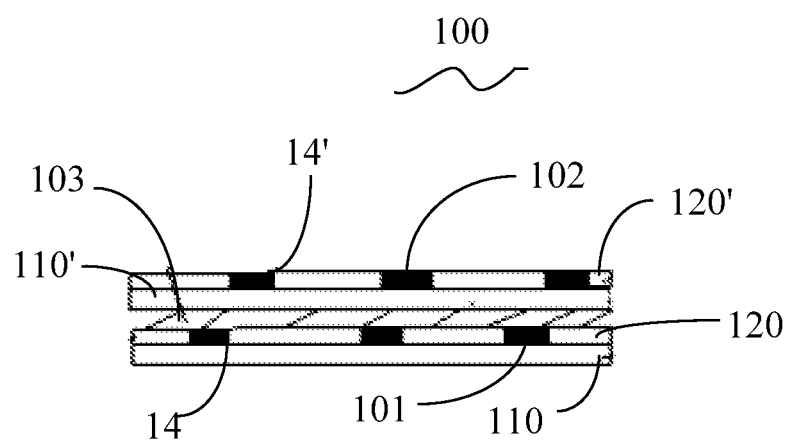
FIG. 1A is a cross-sectional view of a first embodiment of a double-layered transparent conductive film.

Referring to FIG. 1A, which is a cross-sectional view of a first embodiment of a double-layered transparent conductive film 100. From bottom to top, the double-layered transparent conductive film 100 includes a first substrate 110, a first imprint adhesive layer 120, a first conductive layer 101, a tackifier layer 103, a second substrate 110', a second imprint adhesive layer 120', and a second conductive layer 102.

The first substrate 110 is made of PET and has a thickness of 188 μm, the first substrate 110 is transparent.

The first imprint adhesive layer 120 is formed on the first substrate 110. The first imprint adhesive layer 120 is made of UV imprint adhesive. The first imprint adhesive layer 120 defines a first mesh-shaped groove 14 by imprinting, which has a depth of 3 μm, a width of 2.2 μm. The first mesh-shaped groove 14 forms a first mesh, which is a random mesh.

The first conductive layer 101 is formed on the first imprint adhesive layer 120. The first conductive layer 101 includes conductive material (silver) filled in the first mesh-shaped groove 14. The silver filled in the first mesh-shaped groove 14 is self-connected and forms a conductive area. A thickness of the silver, which is about 2 μm, is less than the depth of the groove 14.

The tackifier layer 103 is bonded to the first conductive layer 101.

The second substrate 110' is formed on the tackifier layer 103 and has the same structure and material as the first substrate 110.

The second imprint adhesive layer 120' is formed on the second substrate 110'. The second imprint adhesive layer 120' defines a second mesh-shaped groove 14' by imprinting. The second mesh-shaped groove 14' forms a second mesh, which is a regular mesh.

The second conductive layer 102 is formed on the second imprint adhesive layer 120'. The second conductive layer 102 includes conductive material (silver) filled in the second mesh-shaped groove 14'. The silver filled in the second mesh-shaped groove 14' is self-connected and forms a conductive area. A thickness of the silver, which is about 2 μm, is less than the depth of the groove 14'.

The first conductive layer 101 and the second conductive layer 102 are bonded together by the tackifier layer 102, thus forming the double-layered transparent conductive film 100.

Figure 1B:
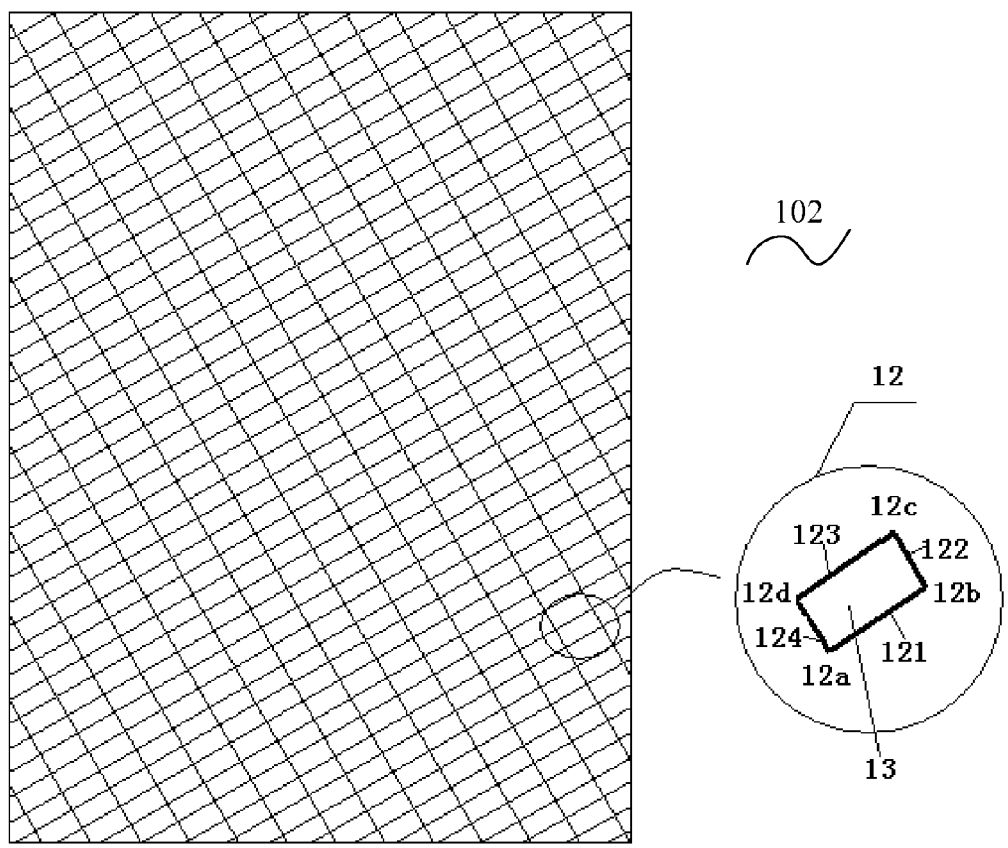
FIG. 1B is a plan view of a second conductive layer of the first embodiment of the double-layered transparent conductive film.

Referring to FIG. 1B, which is a plan view of a second conductive layer 102 of the present embodiment. The second mesh formed by the second mesh-shaped groove 14' is a regular mesh. The regular mesh is formed by parallel arranging a plurality of mesh cells 12. In the illustrated embodiment, a random point is selected as an initial node 12a of the mesh cell 12, a grid line 121 extends from a node 12a to a node 12b; a grid line 124 also extends from the node 12a in a direction different from that of the grid line 121 to reach a node 12d; a grid line 122 and a grid line 123 extend from the node 12b, 12d in a direction different from that of the grid line 124, 121 and intersected to form a node 12c, such that a regular quadrilateral mesh cell 12 is formed. Similarly, each node is selected and the process is repeated to form the mesh of the second conductive layer 102. In other words, the grid lines 121, 122, 123, and 124 cooperatively form the mesh cell 12. A grid line forming the mesh cell 12 has a length of 280 μm. Four grid lines of the mesh cell 12 surrounds a middle blank area 13, which is an insulating area used as a translucent area. A ratio of an area of a middle blank area 13 to that of the mesh cell 12 is greater than 95%, i.e. a ratio of an area of a middle blank area in the regular mesh of the second conductive layer 102 to a total area of the second conductive layer 102 is greater than 95%, such ratio allows for a higher transmittance of the conductive film.

Figure 2:
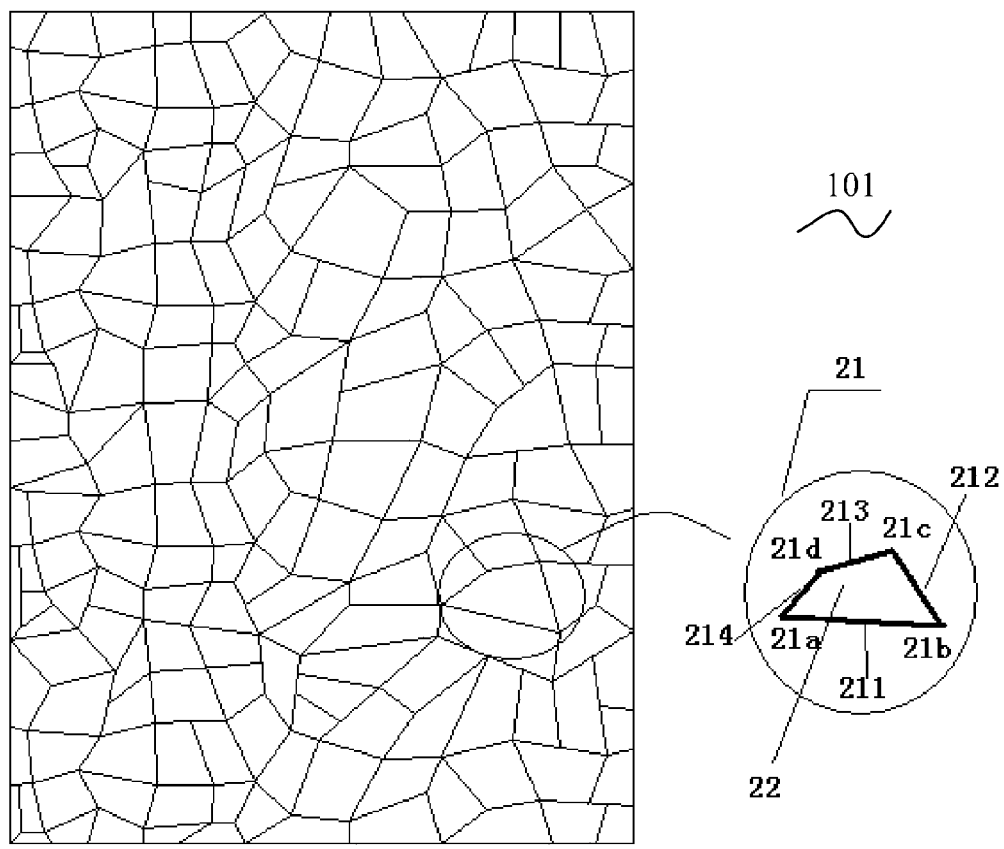
FIG. 2 is a plan view of a first conductive layer of the first embodiment.

Referring to FIG. 2, which is a plan view of a first conductive layer 101 of the first embodiment. The first mesh formed by the second mesh-shaped groove 14' is a random mesh. The random mesh is formed by arranging a plurality of mesh cells 21. A random point is selected as an initial node 21a of the mesh cell 21, a grid line 211 extends from a node 21a to a node 21b; a grid line 214 also extends from the node 21a in a direction different from that of the grid line 211 to reach a node 21d; a grid line 212 and a grid line 213 extend from the node 21b, 21d in a direction different from that of the grid line 214, 211 and intersected to form a node 21c, such that a irregular quadrilateral mesh cell 21 is formed. Similarly, each node is selected and the process is repeated to form the mesh of the second conductive layer 101. In other words, the grid lines 211, 212, 213, and 214 cooperatively form the mesh cell 21. Four grid lines of the mesh cell 21 surrounds a middle blank area 22, which is an insulating area used as a translucent area. A ratio of an area of a middle blank area 22 to that of the mesh cell 21 is greater than 95%, i.e. a ratio of an area of a middle blank area in the random mesh of the first conductive layer 101 to a total area of the first conductive layer 101 is greater than 95%. A perimeter of the mesh cell 21 is the same as that of the mesh cell 12 of the second conductive layer 102. In alternative embodiment, the formation of the irregular quadrilateral can be as follows: firstly, a regular square mesh cell is designed, then each node of the square moves, and the moved nodes ensure that the connected quadrilateral is a irregular quadrilateral. A moving method of the node can be a random movement using the original node as a center moving in a distance d from the origin node. The grid lines 211, 212, 213, and 214 cooperatively form the mesh cell 21.

Figure 5:
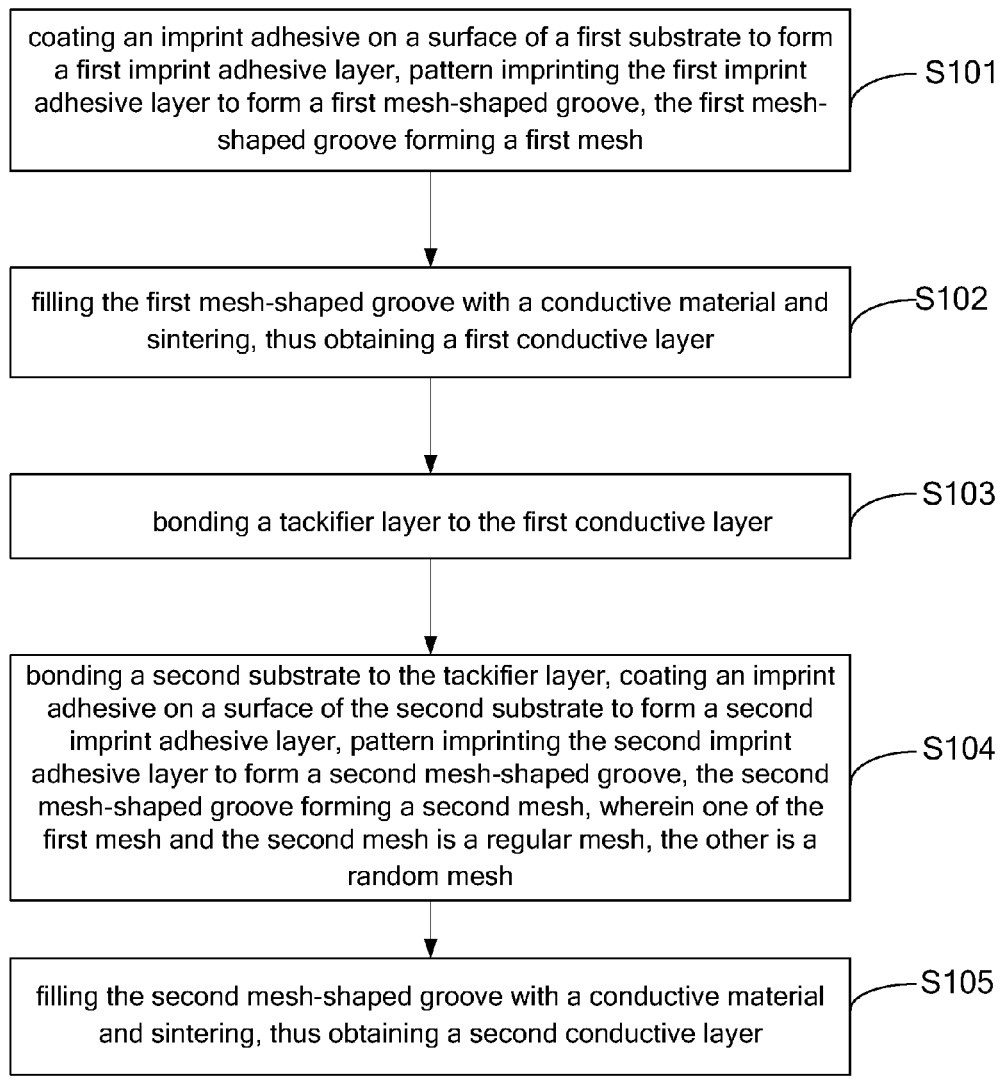
FIG. 5 is a flow chart of a manufacturing method of the first embodiment of the double-layered transparent conductive film.

Referring to FIG. 5, in the illustrated embodiment, a method for manufacturing the double-layered conductive film 100 includes the following steps:

Step S101, an imprint adhesive is coated on a surface of the first substrate 110 to form a first imprint adhesive layer 120, the first imprint adhesive layer is pattern imprinted to form the first mesh-shaped groove 14, the first mesh-shaped groove 14 forms a first mesh, which is a random mesh.

Step S102, the first mesh-shaped groove 14 is filled with conductive material and sintered, thus the first conductive layer 101 is obtained.

The conductive material is silver.

Step S103, the tackifier layer 103 is bonded to the first conductive layer 101.

The tackifier layer 103 is used for a better bonding between the first conductive layer 101 and the second conductive layer 102.

Step S104, a second substrate 110' is bonded to the tackifier layer 103, an imprint adhesive is coated on a surface of the second substrate 110' to form a second imprint adhesive layer 120', the second imprint adhesive layer 120' is pattern imprinted to form a second mesh-shaped groove 14', the second mesh-shaped groove 14' forms the second mesh, which is a regular mesh.

Step 105, the second mesh-shaped groove 14' is filled with conductive material and sintered, thus the second conductive layer 102 is obtained.

Using the first conductive layer 101 as a sensing layer, the second conductive layer 102 as a driving layer, the two layers are laminated and bonded via the tackifier layer 103. During the lamination of the first conductive layer 101 and the second conductive layer 102, no alignment accuracy is needed, such that undesirable optical phenomena as well as the color difference between the mesh areas can be avoided, and the production process and equipment requirements are relatively low.

Embodiment Two

Figure 3:
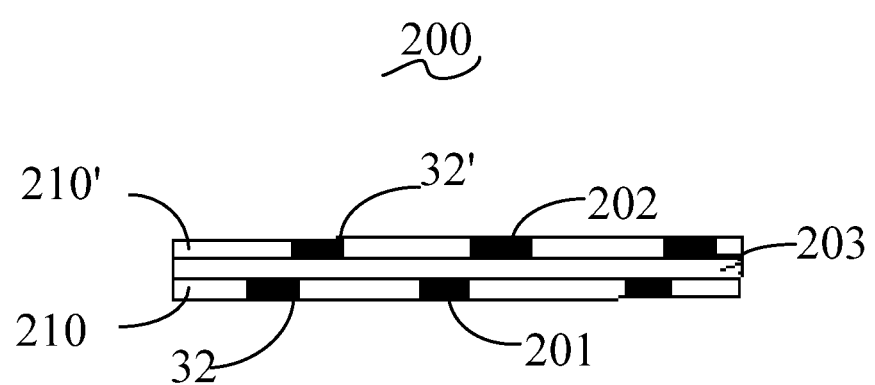
FIG. 3 is a cross-sectional view of a second embodiment of a double-layered transparent conductive film.

FIG. 3 is a cross-sectional view of a second embodiment of a double-layered transparent conductive film 200. From bottom to top, the double-layered transparent conductive film 200 includes a first conductive layer 201, a first imprint adhesive layer 210, a substrate 203, a second imprint adhesive layer 210', and a second conductive layer 202.

The substrate 203 is disposed between the two conductive layers. The substrate 203 is made of PET and has a thickness of 188 μm.

The first imprint adhesive layer 210 is formed on a lower surface of the substrate 203. The first imprint adhesive layer 210 defines a first mesh-shaped groove 32 by imprinting, which has a depth of 3 μm, a width of 2.2 μm. The first mesh-shaped groove 32 forms a first mesh, which is a random mesh.

The first conductive layer 201 is formed on the first imprint adhesive layer 210. The first conductive layer 201 includes conductive material (silver) filled in the first mesh-shaped groove 32. A thickness of the silver, which is about 2 μm, is less than the depth of the groove 32. Since the first mesh-shaped groove 32 by imprinting is communicated, the silver filled therein forms a conductive area.

The second imprint adhesive layer 210' is formed on an upper surface of the substrate 203. The second imprint adhesive layer 210' defines a second mesh-shaped groove 32' by imprinting. The second mesh-shaped groove 32' forms a second mesh, which is a regular mesh.

Similarly, the second conductive layer 202 is formed on the second imprint adhesive layer 210'. The second conductive layer 202 includes conductive material (silver) filled in the second mesh-shaped groove 32'. The silver filled in the second mesh-shaped groove 32' is self-connected and forms a conductive area.

Figure 3A:
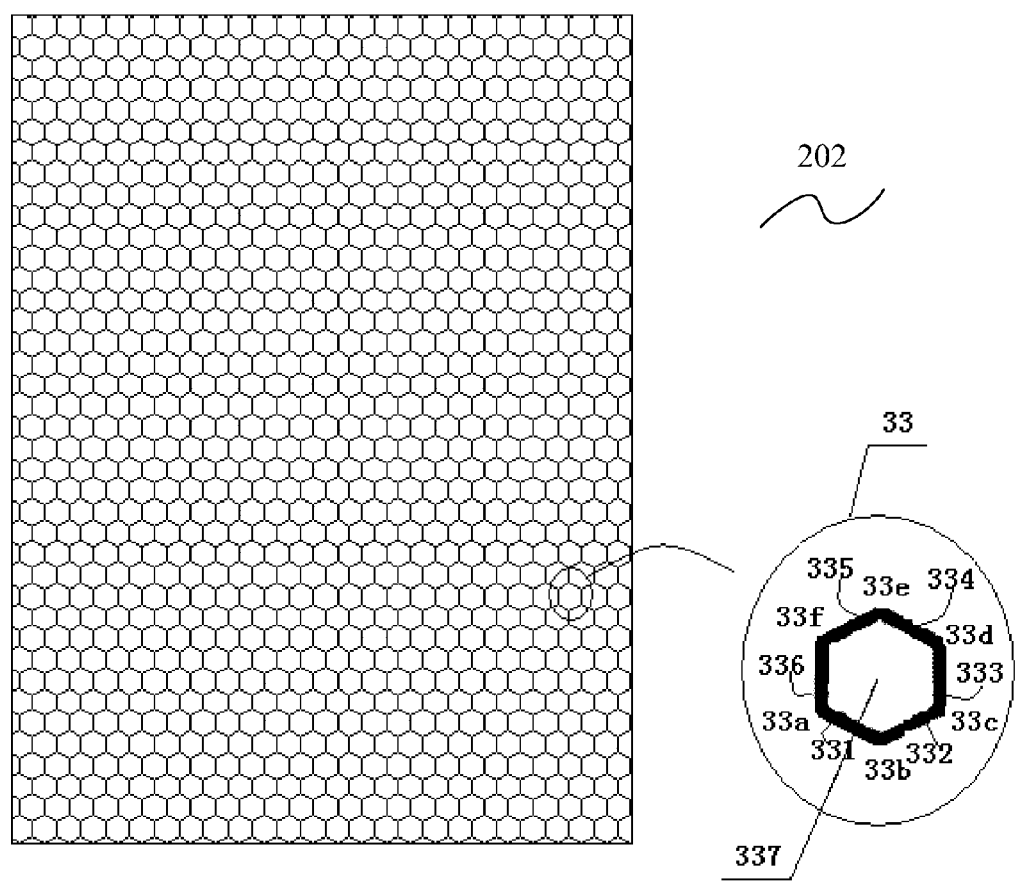
FIG. 3A is a plan view of a second conductive layer of the second embodiment.

FIG. 3A shows a plan view of the second conductive layer 202 of the present embodiment. The second mesh formed by the second mesh-shaped groove 32' is a regular mesh. The regular mesh is formed by parallel arranging a plurality of mesh cells 33. The mesh cell 33 is shaped as a regular hexagonal. A random point is selected as an initial node 33a of the mesh cell 33, a grid line 331 extends from a node 33a to a node 33b; a grid line 332 extends from the node 33b to a node 33c, a grid line 333 extends from the node 33c to a node 33d, a grid line 334 extends from the node 33d to a node 33e, a grid line 335 extends from the node 33e to a node 33f, a grid line 336 extends from the node 33f to a node 33e, such that a regular hexagonal mesh cell 33 is formed. Repeat the described process until the plurality of mesh cells 33 cooperatively form the regular mesh. The mesh cell 33 surrounds a middle blank area 337, which is an insulating area used as a translucent area. A ratio of an area of a middle blank area 337 to that of the mesh cell 33 is greater than 96.2%, i.e. a ratio of an area of a middle blank area in the regular mesh of the second conductive layer 202 to a total area of the second conductive layer 202 is greater than 96.2%, such ratio allows for a higher transmittance of the conductive film. The mesh cell 33 has a perimeter of 280 μm.

Figure 3B:
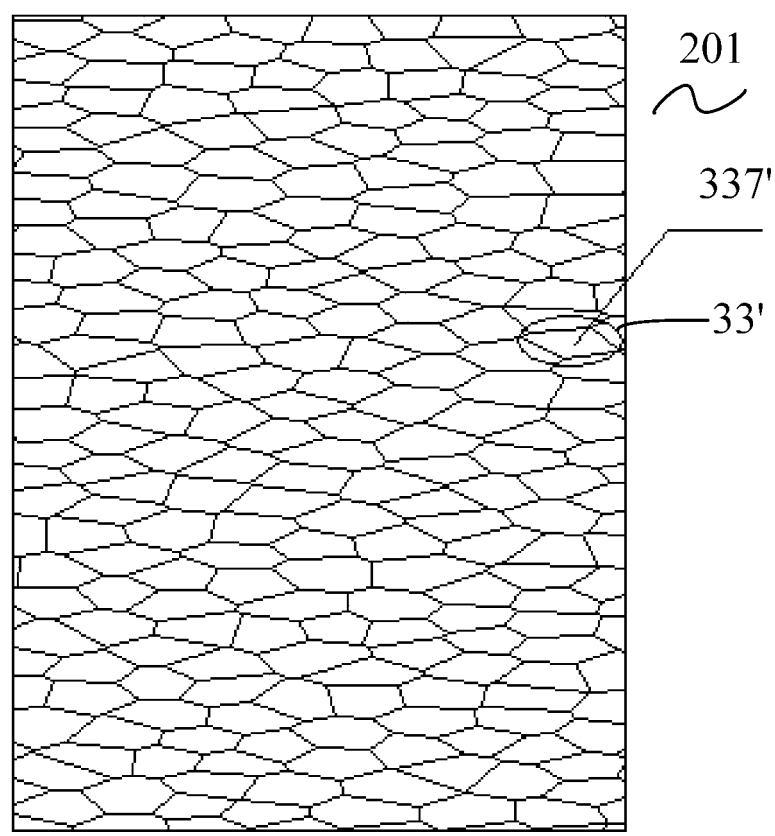
FIG. 3B is a plan view of a first conductive layer of the second embodiment.

FIG. 3B is a plan view of the first conductive layer 201 of the present embodiment. The first mesh formed by the first mesh-shaped groove 32 is a random mesh. The random mesh is formed by arranging a plurality of mesh cells 33'. The mesh cell 33' is an irregular polygon, such as irregular triangle, square or pentagon, etc. A plurality of mesh cell 33' form the random mesh of the first conductive layer 201, whose grid line is a straight segment. The number of grid lines of the irregular polygon mesh having a slope in a range of (−1, 1) is greater than the number of grid lines having a slope in a range (−∞, −1) and (1, +∞), i.e., the number of grid lines having an angle with the X axis of less than or equals to 45° is greater than the number of grid lines having an angle with the X axis of greater than to 45°. Alternatively, The number of grid lines of the irregular polygon mesh having a slope in a range of (−1, 1) is less than the number of grid lines having a slope in a range (−∞, −1) and (1, +∞). A blank are surrounded by four grid lines of the mesh cell 33' is an insulating area, which also serves as a translucent area.

Figure 6:
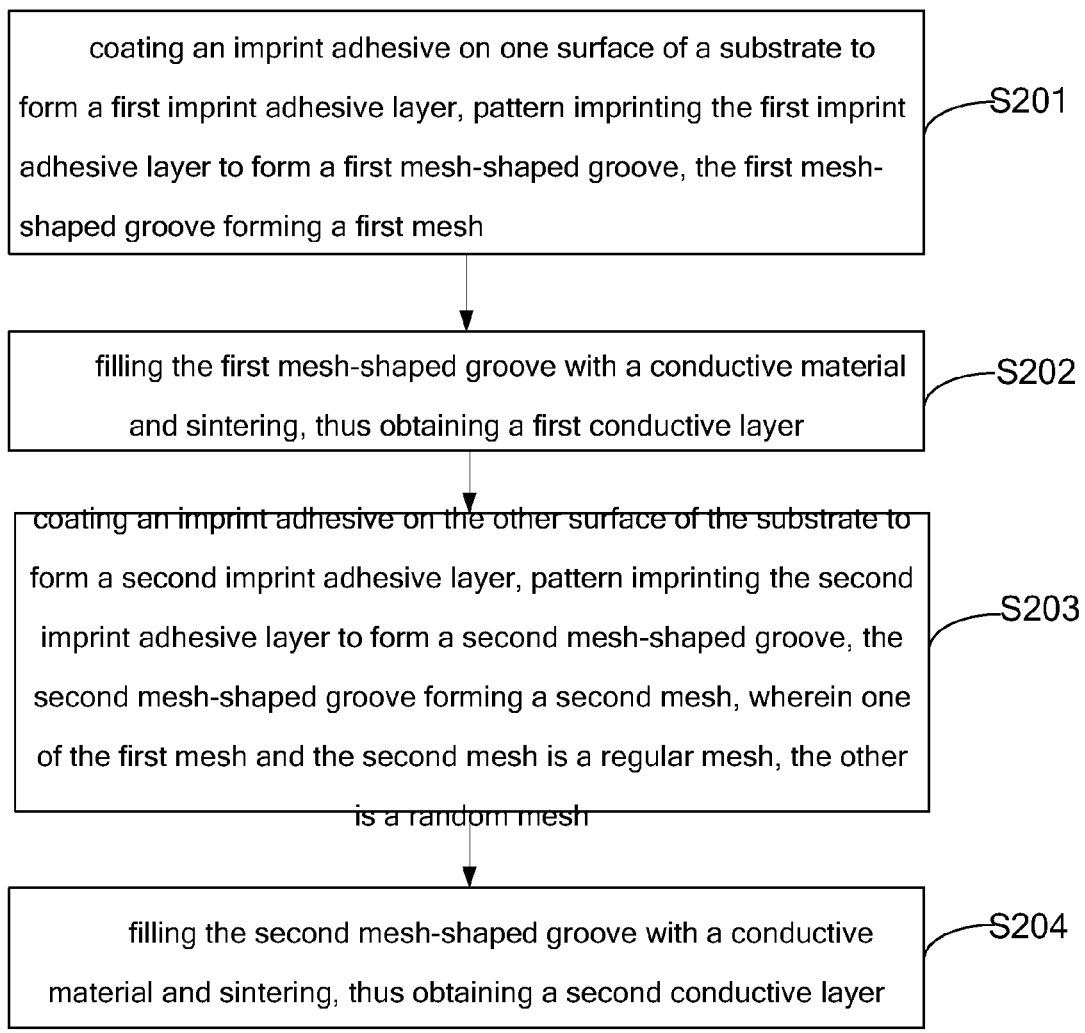
FIG. 6 is a flow chart of a manufacturing method of the second embodiment of the double-layered transparent conductive film.

Referring to FIG. 6, in the illustrated embodiment, a method for manufacturing the double-layered conductive film 200 includes the following steps:

Step S201, an imprint adhesive is coated on one surface of a substrate 203 to form a first imprint adhesive layer 210, the first imprint adhesive layer is pattern imprinted to form a first mesh-shaped groove 32, the first mesh-shaped groove 32 forms a first mesh, which is a random mesh.

Step S202, the first mesh-shaped groove is filled with conductive material and sintered, thus a first conductive layer 201 is obtained.

The conductive material is silver.

Step S203, an imprint adhesive is coated on the other surface of the substrate 203 to form a second imprint adhesive layer 210', the second imprint adhesive layer is pattern imprinted to form a second mesh-shaped groove 32', the second mesh-shaped groove 32' forms a second mesh, which is a regular mesh.

Step S204, the second mesh-shaped groove 32' is filled with conductive material and sintered, thus the second conductive layer 202 is obtained.

The first conductive layer 201 includes a plurality of mesh cells 33' of irregular polygons. The plurality of mesh cells 33' forms the random mesh. The second conductive layer 202 includes a plurality of mesh cells 33 of hexagonal, which form a regular mesh. During the formation of the regular mesh cell 33 of the second conductive layer 202, no alignment accuracy is needed for the lamination of the first conductive layer 101 and the second conductive layer 102, such that undesirable optical phenomena as well as the color difference between the mesh areas can be avoided, and the production process and equipment requirements are relatively low.

Embodiment Three

Figure 4:
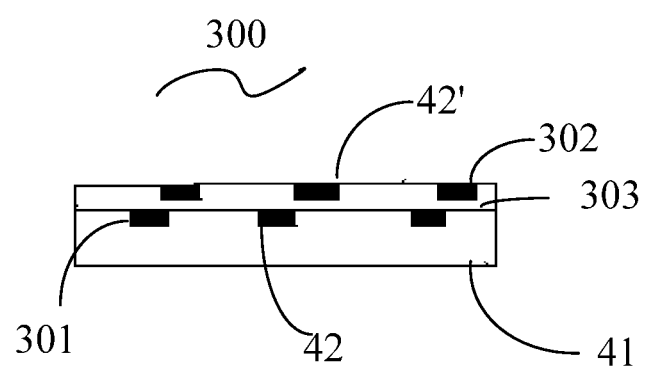
FIG. 4 a cross-sectional view of a third embodiment of a double-layered transparent conductive film.

Referring to FIG. 4, a double-layered transparent conductive film 300 of the present embodiment has a single-sided and double-layered structure. From bottom to up, the double-layered transparent conductive film 300 includes a substrate 41, a first conductive layer 301, an isolation layer 303, and a second conductive layer 302.

The first conductive layer 301 is formed on the substrate 41. The first conductive layer 301 includes conductive material filled in the first mesh-shaped groove 42. The conductive material according to the present embodiment is silver. A thickness of the silver, which is about 2 μm, is less than the depth of the groove 42. The silver filled in the first mesh-shaped groove 42 is self-connected and forms the first conductive layer 301.

The isolation layer 303 is disposed on the first conductive layer 301. The isolation layer 303 is made of polymer, such as UV imprint adhesive. The isolation layer 303 defines a second mesh-shaped groove 42'. The second mesh-shaped groove 42' forms a mesh, which is a random mesh.

The second conductive layer 302 is disposed on the isolation layer 303. The second conductive layer 302 includes conductive material (silver) filled in the second mesh-shaped groove 42'. A thickness of the silver, which is about 2 μm, is less than the depth of the groove 42'. The silver filled in the first mesh-shaped groove 42' is self-connected and forms the second conductive layer 302.

Figure 4A:
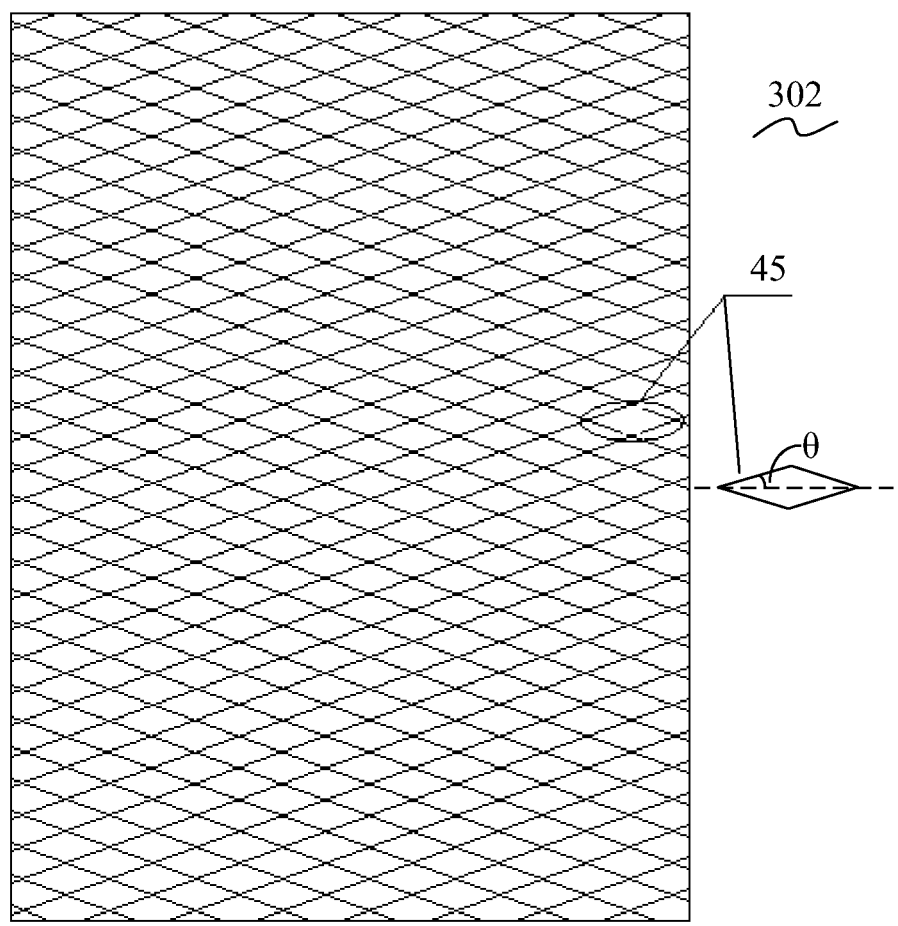
FIG. 4A is a plan view of a second conductive layer of the third embodiment.

FIG. 4A is a plan view of the first conductive layer 301 of the present embodiment. The first mesh-shaped groove 42 forms a regular mesh. The regular mesh includes a plurality of mesh cells 45 which are paralleled arranged. The mesh cell 45 is shaped as a rhombus, which has a gird line forming an angle of 20° with the X axis. The mesh cell 45 surrounds a middle blank area, which is an insulating area used as a translucent area. The first conductive layer 301 has a transmittance in visible light greater than 86.6%.

Figure 4B:
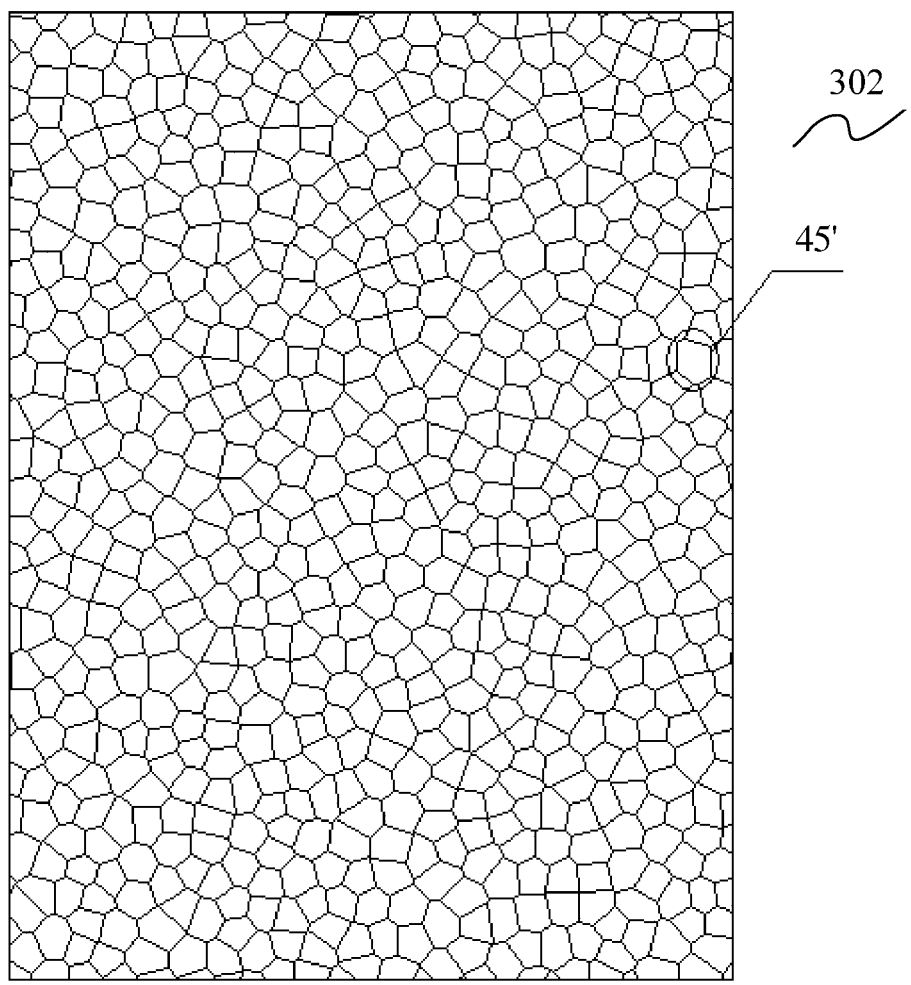
FIG. 4B is a plan view of a first conductive layer of the third embodiment.

FIG. 4B shows a plan view of the second conductive layer 302 of the present embodiment. The second mesh-shaped groove 42' forms a random mesh. The random mesh includes a plurality of mesh cells 45' which are paralleled arranged. The mesh cell 45' is an irregular polygon, a plurality of mesh cell 45' form the random mesh, whose grid line is a straight segment. The random mesh is evenly distributed and satisfies the following conditions: the grid line forms an angle θ with a right horizontal X axis, the angle θ is evenly-distributed, the uniform distribution refers to the statistic value θ of each of the random grids; then gathering statistics for a probability $p_i$ of the grid lines falling within each of angle intervals at a stepper angle of 5°, thus obtaining $p_1, p_2 \ldots p_{36}$ in the 36 angle intervals within 0~180°; $p_i$ satisfies that the standard deviation is less than 20% of an arithmetic mean. The mesh cell 45' surrounds a middle blank area, which is an insulating area used as a translucent area.

Figure 7:
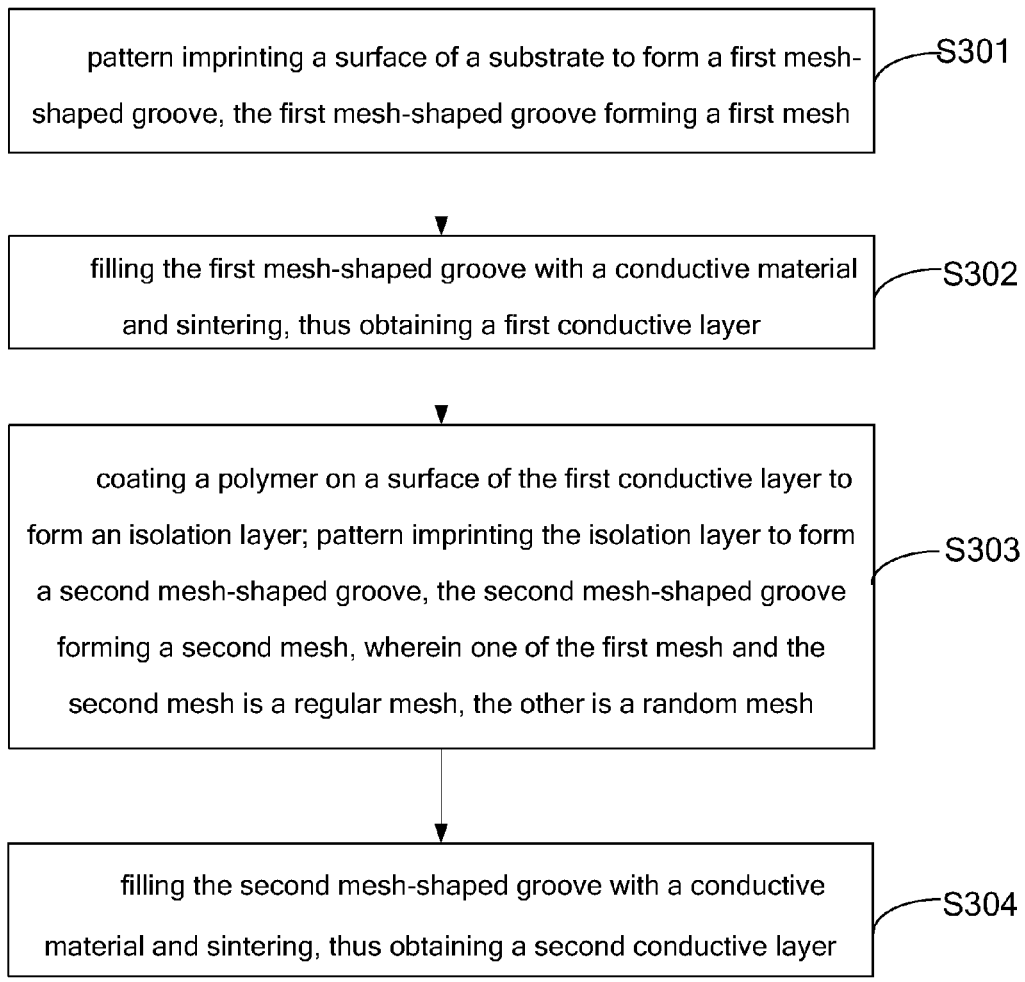
FIG. 7 is a flow chart of a manufacturing method of the third embodiment of the double-layered transparent conductive film.

Referring to FIG. 7, in the illustrated embodiment, a method for manufacturing the double-layered conductive film 300 includes the following steps:

Step S301, a surface of the substrate 41 is pattern imprinted to form the first mesh-shaped groove 42; the first mesh-shaped groove 42 forms a first mesh, which is a regular mesh.

Step S302, the first mesh-shaped groove 42 is filled with conductive material and sintered, thus the first conductive layer 301 is obtained.

The conductive material is silver.

Step S303, a polymer is coated on a surface of the first conductive layer 301 to form an isolation layer 303; the isolation layer 303 is pattern imprinted to form the second mesh-shaped groove 42'. The second mesh-shaped groove 42' forming a second mesh, wherein is a random mesh.

The coated polymer can be a UV imprint adhesive.

Step S304, the second mesh-shaped groove 42' is filled with conductive material and sintered, thus the second conductive layer 302 is obtained.

Firstly, the surface of the substrate 41 is pattern imprinted to form the first mesh-shaped groove 42, which has a depth of 3 μm and a width of 2.2 μm. The entire first mesh-shaped groove 42 on the surface of the substrate 303 is then filled with the conductive material by a scratch technology and sintered, thus the first conductive layer 301 is obtained. Plurality of mesh-shaped grooves 42 arrange and form a regular mesh. The regular mesh is evenly distributed as previously described. The polymer is then pattern coated on the surface of the first conductive layer 301 to form the isolation layer 303, which covers the first conductive layer 301 and has a thickness of 4 μm. The isolation layer 303 is pattern imprinted to form the second mesh-shaped groove 42'. The plurality of the second mesh-shaped groove 42' forms the random mesh. The conductive material is filled in second mesh-shaped groove 42' by a scratch technology and sintered, thus the second conductive layer 302 is obtained.

Although the invention has been described in language specific to structural features and/or methodological acts, it is to be understood that the invention defined in the appended claims is not necessarily limited to the specific features or acts described. Rather, the specific features and acts are disclosed as sample forms of implementing the claimed invention.

What is claimed is:

1. A double-layered transparent conductive film, comprising:
    a first substrate;
    a first imprint adhesive layer formed on the first substrate, the first imprint adhesive layer defining a first mesh-shaped groove, the first mesh-shaped groove forming a first mesh;
    a first conductive layer comprising conductive material filled in the first mesh-shaped groove;
    a tackifier layer formed on the first imprint adhesive layer and the first conductive layer;
    a second substrate formed on the tackifier layer;
    a second imprint adhesive layer formed on the second substrate, the second imprint adhesive layer defining a second mesh-shaped groove, the second mesh-shaped groove forming a second mesh, wherein one of the first mesh and the second mesh is a regular mesh, the other is a random mesh; and
    a second conductive layer comprising conductive material filled in the second mesh-shaped groove;
    a first ratio of a middle blank area in the regular mesh of the conductive layer to a total area of the conductive layer of the regular mesh is greater than 95%;
    a second ratio of a middle blank area in the random mesh of the conductive layer to a total area of the conductive layer of the random mesh is greater than 95%.

2. The double-layered transparent conductive film according to claim 1, wherein a cell of the random mesh is shaped as an irregular quadrilateral.

3. The double-layered transparent conductive film according to claim 1, wherein a cell of the regular mesh is shaped as a rectangular.

4. The double-layered transparent conductive film according to claim 1, wherein the random mesh is an irregular polygon mesh, the number of grid lines of the irregular polygon mesh having a slope in a range of $(-1, 1)$ is greater than the number of grid lines having a slope in a range $(-\infty, -1)$ and $(1, +\infty)$;
    or the number of grid lines of the irregular polygon mesh having a slope in a range of $(-1, 1)$ is less than the number of grid lines having a slope in a range $(-\infty, -1)$ and $(1, +\infty)$.

5. The double-layered transparent conductive film according to claim 1, wherein the regular mesh is a hexagonal mesh.

6. The double-layered transparent conductive film according to claim 1, wherein the random mesh is an irregular polygon mesh, a grid line of the irregular polygon mesh is evenly-distributed, the grid line between two nodes forms an angle $\theta$ with a horizontal X axis, the angle $\theta$ is evenly-distributed, the uniform distribution refers to the statistic value $\theta$ of each of the random grids; then gathering statistics for a probability $p_i$ of the grid lines falling within each of angle intervals at a stepper angle 5°, thus obtaining $p_1, p_2 \ldots p_{36}$ in the 36 angle intervals within 0~180°; $p_i$ satisfies that the standard deviation is less than 20% of an arithmetic mean.

7. A method of manufacturing a double-layered transparent conductive film, comprising the following steps:
    coating an imprint adhesive on a surface of a first substrate to form a first imprint adhesive layer, pattern imprinting the first imprint adhesive layer to form a first mesh-shaped groove, the first mesh-shaped groove forming a first mesh;
    filling the first mesh-shaped groove with conductive material and sintered, thus obtaining a first conductive layer;
    bonding a tackifier layer to the first conductive layer;
    bonding a second substrate to the tackifier layer, coating an imprint adhesive on the surface far away from the tackifier layer of the second substrate to form a second imprint adhesive layer, pattern imprinting the second imprint adhesive layer to form a second mesh-shaped groove, the second mesh-shaped groove forming a second mesh, wherein one of the first mesh and the second mesh is a regular mesh, the other is a random mesh; and
    filling the second mesh-shaped groove with conductive material and sintered, thus obtaining a second conductive layer;
    a first ratio of a middle blank area of the regular mesh of the conductive layer to a total area of the conductive layer of the regular mesh is greater than 95%;
    a second ratio of a middle blank area of the random mesh of the conductive layer to a total area of the conductive layer of the random mesh is greater than 95%.

8. A double-layered transparent conductive film, comprising:
    a substrate;
    a first imprint adhesive layer formed on one surface of the substrate, the first imprint adhesive layer defining a first mesh-shaped groove, the first mesh-shaped groove forming a first mesh;
    a first conductive layer comprising conductive material filled in the first mesh-shaped groove;
    a second imprint adhesive layer formed on the other surface of the substrate, the second imprint adhesive layer defining a second mesh-shaped groove, the second mesh-shaped groove forming a second mesh, wherein one of the first mesh and the second mesh is a regular mesh, the other is a random mesh; and a second conductive layer comprising conductive material filled in the second mesh-shaped groove;

a ratio of a middle blank area of the regular mesh of the conductive layer to a total area of the conductive layer of the regular mesh is greater than 96.2%.

9. A method of manufacturing a double-layered transparent conductive film, comprising the following steps:

coating an imprint adhesive on one surface of a substrate to form a first imprint adhesive layer, pattern imprinting the first imprint adhesive layer to form a first mesh-shaped groove, the first mesh-shaped groove forming a first mesh;

filling the first mesh-shaped groove with conductive material and sintered, thus obtaining a first conductive layer;

coating an imprint adhesive on the other surface of the substrate to form a second imprint adhesive layer, pattern imprinting the second imprint adhesive layer to form a second mesh-shaped groove, the second mesh-shaped groove forming a second mesh, wherein one of the first mesh and the second mesh is a regular mesh, the other is a random mesh; and filling the second mesh-shaped groove with conductive material and sintered, thus obtaining a second conductive layer;

a ratio of a middle blank area of the regular mesh of the conductive layer to a total area of the conductive layer of the regular mesh is greater than 96.2%.

10. A double-layered transparent conductive film, comprising;

a substrate defining a first mesh-shaped groove, the first mesh-shaped groove forming a first mesh;

a first conductive layer comprising conductive material filled in the first mesh-shaped groove, the first conductive layer with a transmittance in visible light greater than 86.6%;

an isolation layer disposed on the first conductive layer, the isolation layer defining a second mesh-shaped groove, the second mesh-shaped groove forming a second mesh, wherein one of the first mesh and the second mesh is a regular mesh, the other is a random mesh; and a second conductive layer comprising conductive material filled in the second mesh-shaped groove.

11. A method of manufacturing a double-layered transparent conductive film, comprising the following steps:

pattern imprinting a surface of a substrate to form a first mesh-shaped groove, the first mesh-shaped groove forming a first mesh;

filling the first mesh-shaped groove with conductive material and sintered, thus obtaining a first conductive layer, the first conductive layer with a transmittance in visible light greater than 86.6%;

coating a polymer on a surface of the first conductive layer to form an isolation layer; pattern imprinting the isolation layer to form a second mesh-shaped groove, the second mesh-shaped groove forming a second mesh, wherein one of the first mesh and the second mesh is a regular mesh, the other is a random mesh; and filling the second mesh-shaped groove with conductive material and sintered, thus obtaining a second conductive layer.

12. The double-layered transparent conductive film according to claim 8, wherein the random mesh is an irregular polygon mesh, the number of grid lines of the irregular polygon mesh having a slope in a range of (−1, 1) is greater than the number of grid lines having a slope in a range (−∞, −1) and (1, +∞).

13. The double-layered transparent conductive film according to claim 8, wherein the random mesh is an irregular polygon mesh, the number of grid lines of the irregular polygon mesh having a slope in a range of (−1, 1) is less than the number of grid lines having a slope in a range (−∞, −1) and (1, +∞).

* * * * *